(12) United States Patent
Okamura et al.

(10) Patent No.: US 10,720,394 B2
(45) Date of Patent: Jul. 21, 2020

(54) ELECTRONIC COMPONENT MOUNTING BOARD AND ELECTRONIC DEVICE

(71) Applicant: KYOCERA Corporation, Kyoto-shi, Kyoto (JP)

(72) Inventors: Takuji Okamura, Satsumasendai (JP); Akihiko Funahashi, Kagoshima (JP)

(73) Assignee: KYOCERA CORPORATION, Kyoto (JP)

(*) Notice: Subject to any disclaimer, the term of this patent is extended or adjusted under 35 U.S.C. 154(b) by 0 days.

(21) Appl. No.: 15/760,976

(22) PCT Filed: Nov. 9, 2016

(86) PCT No.: PCT/JP2016/083266
§ 371 (c)(1),
(2) Date: Mar. 16, 2018

(87) PCT Pub. No.: WO2017/086222
PCT Pub. Date: May 26, 2017

(65) Prior Publication Data
US 2018/0254251 A1 Sep. 6, 2018

(30) Foreign Application Priority Data

Nov. 19, 2015 (JP) ................. 2015-226860

(51) Int. Cl.
*H01L 23/00* (2006.01)
*H01L 33/62* (2010.01)
(Continued)

(52) U.S. Cl.
CPC ........ *H01L 23/562* (2013.01); *H01L 21/4817* (2013.01); *H01L 21/4853* (2013.01);
(Continued)

(58) Field of Classification Search
CPC . H01L 23/562; H01L 24/48; H01L 23/49822; H01L 2224/48091
(Continued)

(56) References Cited

U.S. PATENT DOCUMENTS 6,220,765 B1* 4/2001 Tatoh ................. H01L 31/0203
257/E31.117
2001/0001622 A1 5/2001 Tatoh
(Continued)

FOREIGN PATENT DOCUMENTS

JP 11-074394 A 3/1999
JP 2002-057235 A 2/2002
(Continued)

OTHER PUBLICATIONS

International Search Report, PCT/JP2016/083266, dated Jan. 10, 2017, 2 pgs.
(Continued)

*Primary Examiner* — Bo Fan
(74) *Attorney, Agent, or Firm* — Volpe and Koenig, P.C.

(57) ABSTRACT

An electronic component mounting board includes an inorganic substrate, a wiring board, and a bond. The inorganic substrate includes an electronic component mounting portion in a central area of an upper surface of the inorganic substrate in which an electronic component is mountable. The wiring board is a frame surrounding the electronic component mounting portion on the upper surface of the inorganic substrate. The bond is located between the inorganic substrate and the wiring board. The inorganic substrate includes a downward bend outward from a bond area including the bond.

20 Claims, 9 Drawing Sheets

(51) Int. Cl.
  *H01L 23/13*   (2006.01)
  *H01L 21/48*   (2006.01)
  *H01L 23/053*  (2006.01)
  *H01L 23/498*  (2006.01)
  *H04N 5/225*   (2006.01)
  *H01L 23/552*  (2006.01)
  *H01L 27/146*  (2006.01)
  *H01L 33/48*   (2010.01)

(52) U.S. Cl.
  CPC ........ *H01L 21/4857* (2013.01); *H01L 23/053* (2013.01); *H01L 23/13* (2013.01); *H01L 23/4985* (2013.01); *H01L 23/49822* (2013.01); *H01L 23/49838* (2013.01); *H01L 33/62* (2013.01); *H01L 23/552* (2013.01); *H01L 24/29* (2013.01); *H01L 24/32* (2013.01); *H01L 24/48* (2013.01); *H01L 24/49* (2013.01); *H01L 24/73* (2013.01); *H01L 27/14618* (2013.01); *H01L 33/486* (2013.01); *H01L 2224/2929* (2013.01); *H01L 2224/29339* (2013.01); *H01L 2224/32245* (2013.01); *H01L 2224/48091* (2013.01); *H01L 2224/48227* (2013.01); *H01L 2224/49175* (2013.01); *H01L 2224/73265* (2013.01); *H01L 2224/83862* (2013.01); *H01L 2924/00014* (2013.01); *H01L 2924/12041* (2013.01); *H01L 2924/12043* (2013.01); *H01L 2924/1576* (2013.01); *H01L 2924/15159* (2013.01); *H01L 2924/15747* (2013.01); *H01L 2924/16195* (2013.01); *H01L 2924/3025* (2013.01); *H01L 2924/3512* (2013.01); *H04N 5/2253* (2013.01)

(58) Field of Classification Search
  USPC .................................................. 257/659, 723
  See application file for complete search history.

(56) References Cited

U.S. PATENT DOCUMENTS

| | | | |
|---|---|---|---|
| 2006/0220232 A1* | 10/2006 | Tanida | H01L 27/14618 257/723 |
| 2008/0093118 A1* | 4/2008 | Takahashi | H05K 3/4691 174/264 |
| 2016/0128181 A1 | 5/2016 | Yamada et al. | |

FOREIGN PATENT DOCUMENTS

| | | |
|---|---|---|
| JP | 2002-198606 A | 7/2002 |
| JP | 2006-278726 A | 10/2006 |
| JP | 2010-220245 A | 9/2010 |
| WO | 2015/163095 A1 | 10/2015 |

OTHER PUBLICATIONS

Written Opinion of the International Searching Authority dated Jan. 10, 2017 for the PCT International Application No. PCT/JP2016/083266.

* cited by examiner

ELECTRONIC COMPONENT MOUNTING BOARD AND ELECTRONIC DEVICE

BACKGROUND

1. Technical Field

The present invention relates to a wiring board for mounting an electronic component, such as an imaging device including a charge-coupled device (CCD) or a complementary metal oxide semiconductor (CMOS) device, a light-emitting device including a light emitting diode (LED), or an integrated circuit, and to an electronic device.

2. Description of the Background

An electronic component mounting board including an inorganic substrate and a wiring board is known. An electronic device including such an electronic component mounting board and an electronic component mounted on the mounting board is also known.

As described in Japanese Unexamined Patent Application Publication No. 2010-220245, electronic devices have been thinner, and thus packages for mounting electronic components have also become thinner. In response to the demand for thinner products, wiring boards have also become thinner.

However, an electronic component mounting board including a thinner wiring board can receive external impacts applied to an inorganic substrate when dropped, which then affect the wiring board, or crack or break the wiring board. The wiring board with cracks or breaks may have failures to, for example, properly transmit signals from an electronic component in the electronic device.

BRIEF SUMMARY

An electronic component mounting board according to one aspect of the present invention includes an inorganic substrate, a wiring board, and a bond. The inorganic substrate includes an electronic component mounting portion in a central area of an upper surface of the inorganic substrate in which an electronic component is mountable. The wiring board is a frame surrounding the electronic component mounting portion on the upper surface of the inorganic substrate. The bond is located between the inorganic substrate and the wiring board. The inorganic substrate includes a downward bend outward from a bond area including the bond.

An electronic device according to another aspect of the present invention includes an electronic component mounted on the electronic component mounting portion of the inorganic substrate in the electronic component mounting board.

DETAILED DESCRIPTION

Figure 1A:
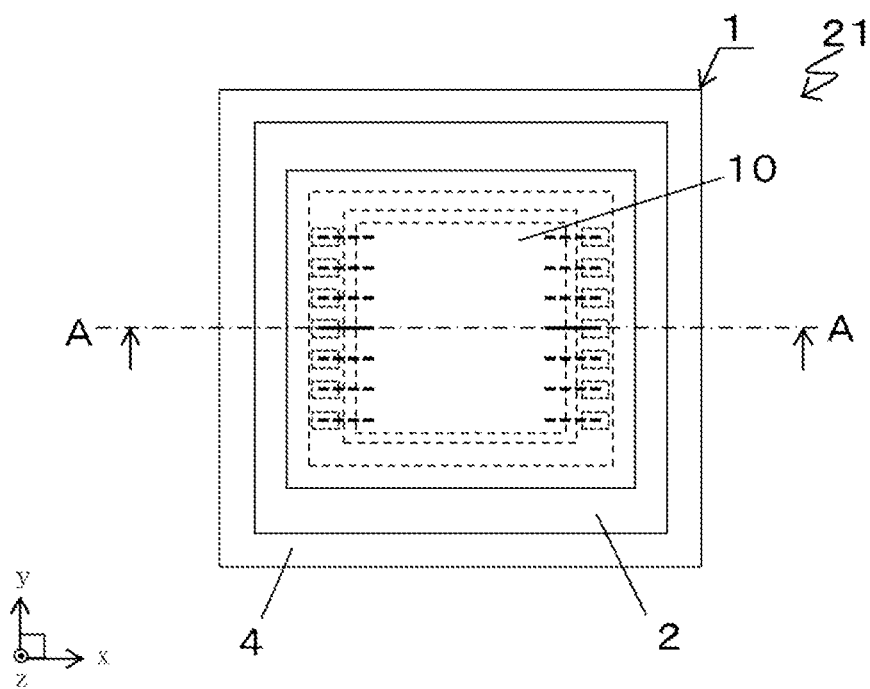
FIG. 1A is an external top view of an electronic component mounting board and an electronic device according to a first embodiment of the present invention.

Embodiments of the present invention will now be described by way of example with reference to the drawings. In the embodiments described below, an electronic device includes an electronic component mounted on an electronic component mounting board with a lid bonded to the upper surface of the electronic component mounting board. Although the electronic component mounting board and the electronic device may be arranged to have any of their faces being upward or downward, they are herein defined using the orthogonal xyz coordinate system with the positive z direction being upward for ease of explanation.

First Embodiment

An electronic device 21 and an electronic component mounting board 1 according to a first embodiment of the present invention will now be described with reference to FIGS. 1A to 3B. The electronic package 21 according to the present embodiment includes the electronic component mounting board 1 and an electronic component 10.

The electronic component mounting board 1 includes an inorganic substrate 4, which includes an electronic component mounting portion 11 in a central area of the upper surface of the inorganic substrate 4, in which an electronic component 10 is mountable, a wiring board 2, which is a frame surrounding the electronic component mounting portion 11 on the upper surface of the inorganic substrate 4, and a bond 15, which is located between the inorganic substrate 4 and the wiring board 2. The inorganic substrate 4 includes downward bends outward from a bond area including the bond 15.

The electronic component mounting board 1 includes the inorganic substrate 4 including the electronic component mounting portion 11 in the central area of the upper surface of the inorganic substrate 4, in which the electronic component 10 is mountable. The inorganic substrate 4 is comprising, for example, a material with high thermal conductivity. Examples of the material for the inorganic substrate 4 include sintered aluminum nitride, sintered silicon nitride, and silicon (Si). When the inorganic substrate 4 is comprising, for example, sintered aluminum nitride or sintered silicon nitride, the inorganic substrate 4 may be a laminate of multiple insulating layers. The inorganic substrate 4 may also be a laminate of multiple insulating layers having its surface covered with a conductive layer. The inorganic substrate 4 includes the central area 11 in the upper surface, in which the electronic component 10 is mountable.

The inorganic substrate 4 may also be comprising a metal material. Examples of the metal material include stainless steel (SUS), an Fe—Ni—Co alloy, alloy 42, copper (Cu), Kovar, and a copper alloy. When, for example, the wiring board 2 is comprising sintered aluminum oxide with a coefficient of thermal expansion of about $5 \times 10^{-6}$/° C. to $10 \times 10^{-6}$/° C., the inorganic substrate 4 may be comprising stainless steel (SUS 410) with a coefficient of thermal expansion of about $10 \times 10^{-6}$/° C. In this case, the wiring board 2 undergoes thermal contraction and expansion with small differences from the inorganic substrate 4. This reduces deformation of the electronic component mounting portion 11. This reduces optical axis misalignment between an imaging device and a lens for the electronic component 10 that is an imaging device, thus producing clear images. The inorganic substrate 4 comprising a metal material, which is non-magnetic, is prevented from being magnetized, and is prevented from interfering with the operation of external devices, such as a lens drive.

The electronic component 10 is, for example, an imaging device such as a charge-coupled device (CCD) or a complementary metal oxide semiconductor (CMOS) device, a light-emitting device such as a light emitting diode (LED), or an integrated circuit. The electronic component 10 may be mounted on the upper surface of the inorganic substrate 4 with an adhesive 16. The adhesive 16 is, for example, silver epoxy or a thermosetting resin.

The electronic component mounting board 1 includes the wiring board 2, which is a frame surrounding the electronic component mounting portion 11. The wiring board 2 includes electronic component connection pads 3 on its upper surface. Although not shown, the wiring board 2 may have a plurality of electrodes for connection to external circuits on its lower surface. The electrodes are to be connected to external circuits or to the inorganic substrate 4. The wiring board 2 may be comprising, for example, an electrical insulating ceramic material or a resin (plastics).

Examples of the electrical insulating ceramic material used for the wiring board 2 include sintered aluminum oxide, sintered mullite, sintered silicon carbide, sintered aluminum nitride, sintered silicon nitride, and sintered glass ceramic. Examples of the resin used for the wiring board 2 include an epoxy resin, a polyimide resin, an acryl resin, a phenolic resin, and a fluorine-based resin. Examples of the fluorine-based resin include a polyester resin and a polytetrafluoroethylene resin.

Figure 1B:
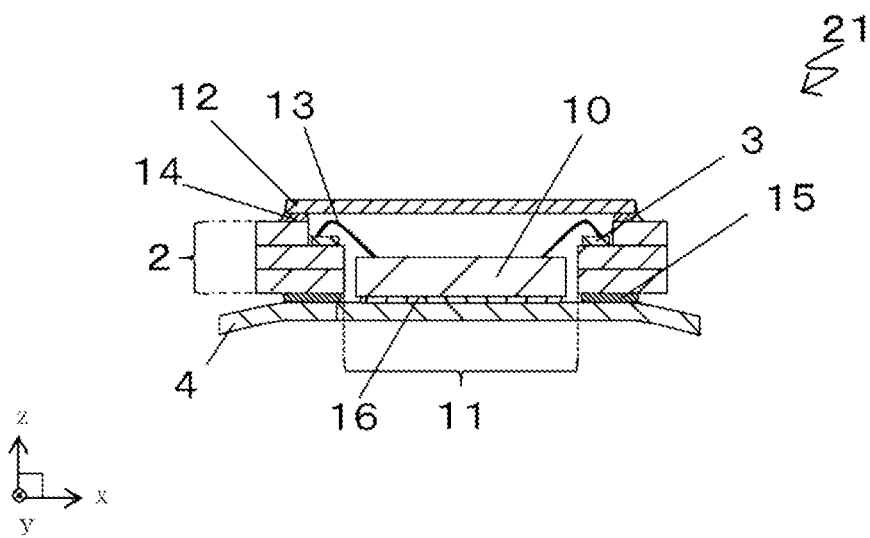
FIG. 1B is a cross-sectional view taken along line A-A in FIG. 1A.

The wiring board 2 may be a laminate of multiple insulating layers comprising the above material, which are stacked on one another. The insulating layers forming the wiring board 2 may include three insulating layers as shown in FIG. 1B, or may include a single, two, four, or more insulating layers. As in the examples shown in FIGS. 1A to 3B, the insulating layers forming the wiring board 2 may have openings with different sizes to define a step on which the electronic component connection pads 3 may be arranged.

The wiring board 2 may have the pads for connection to external circuits on its upper surface, side surface, or lower surface. The electrodes for connection to external circuits electrically connect the wiring board 2 or the electronic device 21 to external circuit boards.

The wiring board 2 contains inner wires within the wiring board or between the insulating layers forming the wiring board, and feedthrough conductors that vertically connect between the inner wires. The inner wires or the feedthrough conductors may be uncovered on the surface of the wiring board 2. The inner wires or the feedthrough conductors may electronically connect the electrodes for connection to external circuits to the electronic component connection pads 3.

When the wiring board 2 is comprising an electrical insulating ceramic material, the electronic component connection pads 3, the electrodes for connection to external circuits, the inner wires, and the feedthrough conductors are comprising tungsten (W), molybdenum (Mo), manganese (Mn), silver (Ag), or copper (Cu), or an alloy containing one or more of these metals. When the wiring board 2 is comprising a resin, the electronic component connection pads 3, the electrodes for connection to external circuits, the inner wires, and the feedthrough conductors are comprising copper (Cu), gold, (Au), aluminum (Al), nickel (Ni), molybdenum (Mo), or titanium (Ti), or an alloy containing one or more of these metals.

The uncovered surfaces of the electronic component connection pads 3, the electrodes for connection to external circuits, the inner wires, and the feedthrough conductors may be plated. The plating layer protects the uncovered surfaces of the electronic component connection pads 3, the electrodes for connection to external circuits, the inner wires, and the feedthrough conductors against oxidation. The plating also improves the electrical connection between the electronic component connection pads 3 and the electronic component 10 with a connection 13, such as wire bonding. The plating layer may be, for example, a Ni plating layer with a thickness of 0.5 to 10 μm, which may further be coated with a gold (Au) plating layer with a thickness of 0.5 to 3 μm.

The wiring board 2 may include a lid 12 for sealing. The lid 12 may be, for example, a flat plate. The lid 12 is a highly transparent member comprising, for example, a glass material, when the electronic component 10 is an imaging device or a light-emitting device such as an LED. The lid 12 may be a metal member when the electronic component 10 is a semiconductor circuit device. The lid 12 is bonded to the upper surface of the wiring board 2 with a bond member 14 such as a thermosetting resin and a brazing material comprising glass with a low melting point or a metal component.

The electronic component mounting board 1 includes a bond 15 between the inorganic substrate 4 and the wiring board 2. The bond 15 may be uncovered inside a cutout in the wiring board 2 (described later) as viewed from above.

Examples of the material for the bond 15 include a thermosetting resin and a brazing material. Examples of the thermosetting resin used for the bond 15 include a bisphenol A liquid epoxy resin. Examples of the brazing material used for the bond 15 include solder, lead, and glass.

The bond 15 may be conductive. Examples of the bond 15 include silver epoxy, solder, an anisotropic conductive resin (anisotropic conductive paste or ACP), and an anisotropic conductive film (ACF). The conductive bond 15 may electrically connect the wiring board 2 to the inorganic substrate 4. For example, the wiring board 2 is electrically connected to the inorganic substrate 4 with the same potential as a ground electrode. This allows the inorganic substrate 4 to function as a shield for protecting the electronic component 10 from external noise.

The inorganic substrate 4 includes downward bends outward from the bond area including the bond 15. The electronic device 21 is typically to be thinner, and an electronic component mounting package is also to be thinner. In response to this demand, the wiring board 2 is also to be thinner. However, the electronic component mounting board 1 including the thinner wiring board 2 can receive external impacts applied to an inorganic substrate 4 when dropped, which then affect the wiring board 2, or crack or break the wiring board 2. The wiring board 2 with cracks or breaks may have failures to, for example, properly transmit signals from the electronic component 10 in the electronic device 21. In the present embodiment, the electronic component mounting board 1 includes the inorganic substrate 4 having downward bends outward from the bond area including the bond 15. When the electronic component mounting board 1 is dropped, the downward bends of the inorganic substrate 4 first receive stress. Having no bond 15 in one portion between the wiring board 2 and the inorganic substrate 4, the electronic component mounting board 1 receives less stress affecting the wiring board 2. The inorganic substrate 4 reduces external stress applied to the wiring board 2 when the electronic component mounting board 1 is dropped, thus reducing cracks or breaks in the wiring board 2. The outward bend of the inorganic substrate 4 may function as a buffer, and may thus reduce drop stress.

Figure 2A:
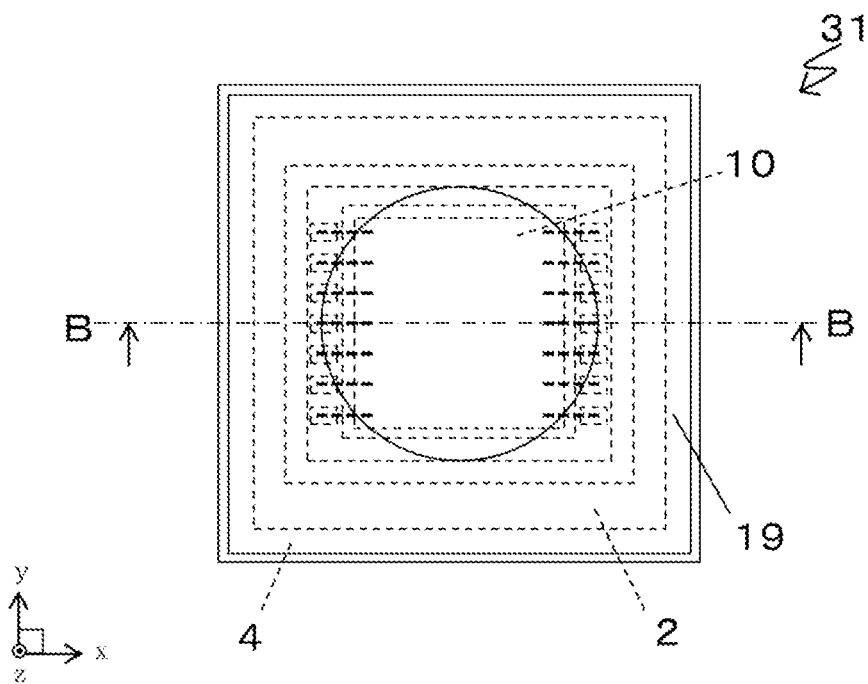
FIG. 2A is an external top view of an electronic module according to an example of the first embodiment of the present invention.
Figure 2B:
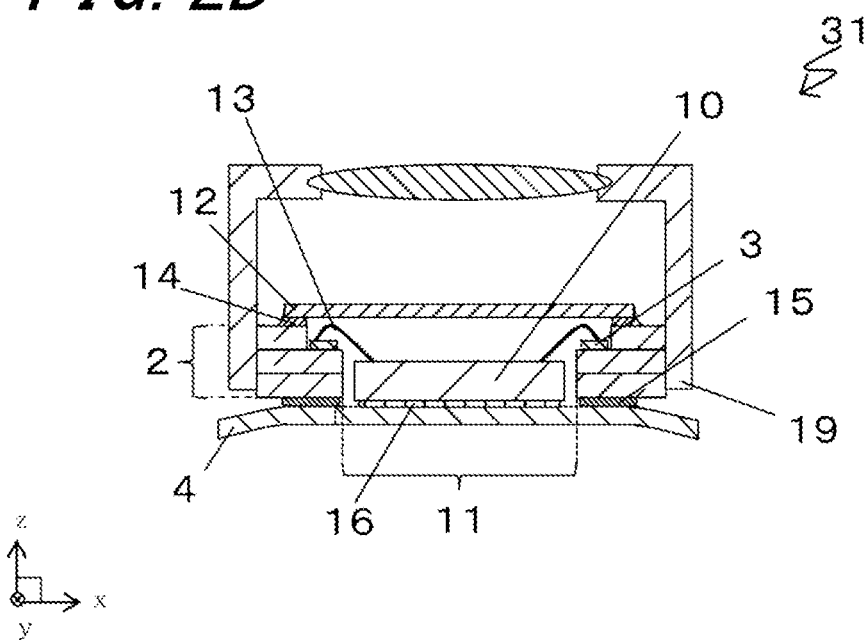
FIG. 2B is a cross-sectional view taken along line B-B in FIG. 2A.

FIGS. 2A and 2B show an electronic module 31 including the electronic component mounting board 1. The electronic module 31 includes the electronic device 21 and an external housing 19 containing the electronic device 21. The electronic device 21 includes the electronic component mounting board 1, and the electronic component 10 mounted on the electronic component mounting portion 11 in the inorganic substrate 4.

As in the example shown in FIGS. 2A and 2B, the electronic module 31 may include the external housing 19. The external housing 19 improves hermetical sealing and reduces external stress directly applied onto the electronic device 21. The electronic component 10 is an imaging device in the example shown in FIGS. 2A and 2B. The external housing 19 includes a housing comprising, for example, a resin, and one or more lenses comprising, for example, a resin, a liquid, glass, or quartz, which is bonded to the housing. The external housing 19 may include, for example, a drive for vertical or horizontal driving, and may be electrically connected to the wiring board 2. The external housing 19 may be designed to fit the electronic component 10 when the component is, for example, a light-emitting device or a semiconductor circuit device.

In the example shown in FIG. 2B, the external housing 19 has its lower end at a position along the wiring board 2 in the thickness direction as viewed in cross section. This structure reduces stress reaching the external housing 19 when the electronic module 31 is dropped to apply stress to the inorganic substrate 4. This structure thus prevents the external housing 19 from being separated from the electronic component 10 or from being deformed.

Although not shown in FIG. 2A, the external housing 19 may have an opening in at least one of the four sides as viewed from above. An external circuit may be placed through the opening in the external housing 19 for electrical connection to the wiring board 2. After the external circuit is electrically connected to the wiring board 2, the opening in the external housing 19 may be sealed with a sealant, such as a resin, to hermetically seal the inside of the electronic module 31.

Figure 3A:
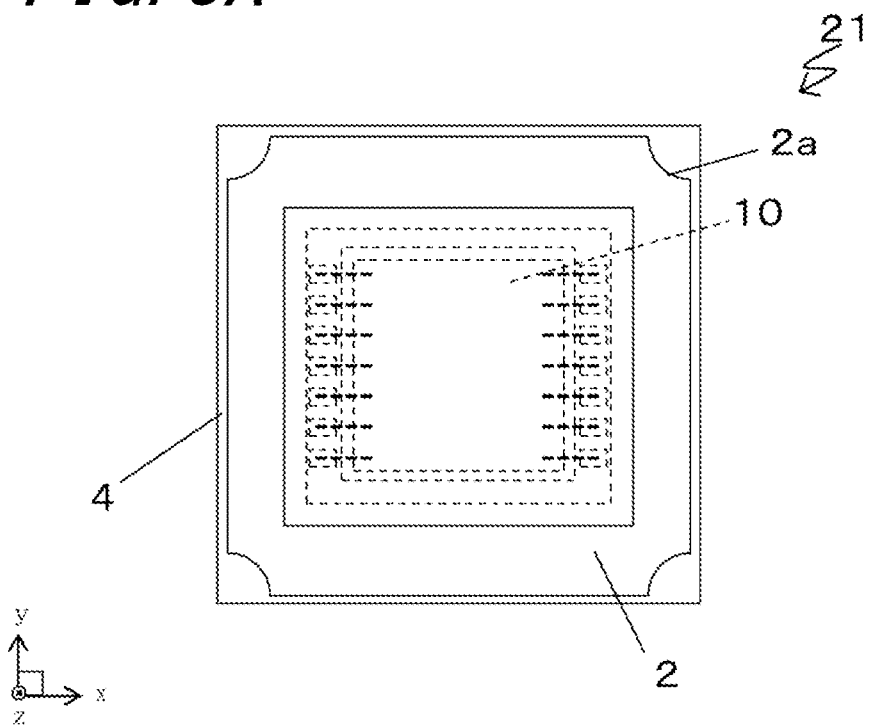
FIGS. 3A and 3B are external top views of the electronic component mounting board and the electronic device according to the first embodiment of the present invention.
Figure 3B:
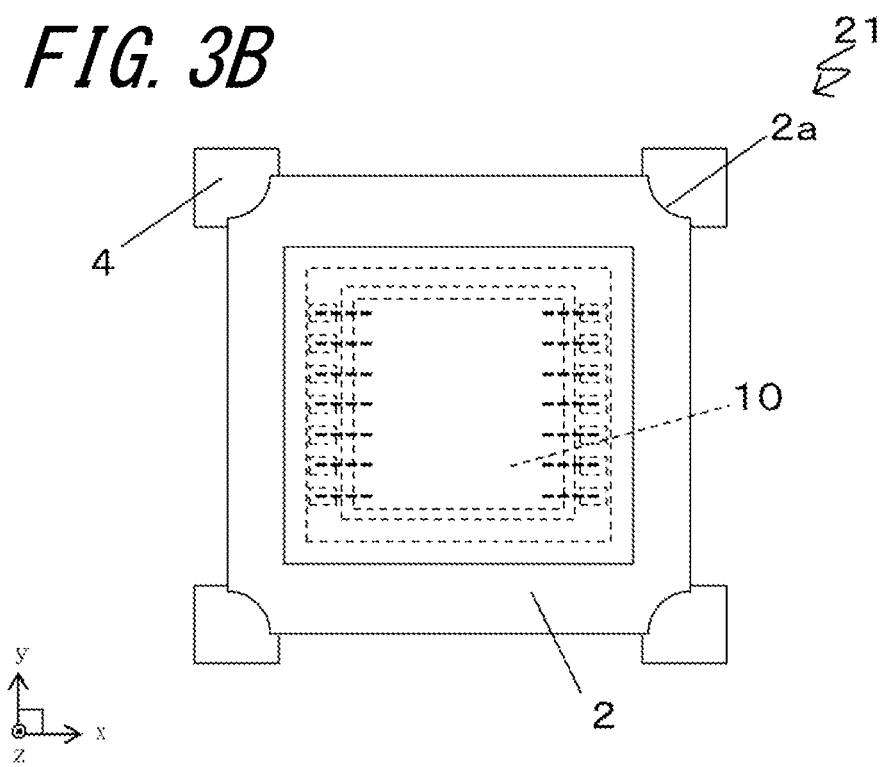

FIGS. 3A and 3B are top views of an electronic device 21 according to an example of the present embodiment. In the example shown in FIGS. 3A and 3B, the wiring board 2 is rectangular, and includes vertically extending grooves 2a on its outer sides. The grooves 2a are located at the corners of the wiring board 2 as viewed from above. The rectangular wiring board 2 may receive stress concentrating around the corners, which may often cause cracks or breaks. In response to this, the wiring board 2 shown in FIGS. 3A and 3B include the grooves 2a at its corners to prevent stress concentration around the corners and more effectively reduce cracks or breaks in the wiring board 2.

In the example shown in FIG. 3B, the inorganic substrate 4 extends outward from the wiring board 2 around the grooves 2a as viewed from above. Such extensions of the inorganic substrate 4 around the grooves 2a on the wiring board 2 can deform to reduce drop stress and thus more effectively reduce cracks or breaks in the wiring board 2.

In the examples shown in FIGS. 1A to 3B, the wiring board 2 is located within the outer edge of the inorganic substrate 4. This wiring board 2 is thus less susceptible to external exposure, and thus reduces cracks and breaks in the wiring board 2. The inorganic substrate 4, which has the outer edge outward from the wiring board 2 as viewed from above, is thus more likely to receive drop impacts or other impacts and reduce impacts on the wiring board 2, thus reducing breaks in the wiring board 2.

The inorganic substrate 4 may also have slits (not shown) on its upper or lower surface, or both the upper and the lower surfaces at the downward bends. The inorganic substrate 4 with this structure further lowers stress at these bends.

An example method for manufacturing the electronic component mounting board 1 and the electronic device 21 according to the present embodiment will now be described. The manufacturing method described below uses a multi-piece wiring substrate including multiple wiring boards 2.

(1) A ceramic green sheet that is to be the wiring board 2 is prepared first. To obtain the wiring board 2 comprising sintered aluminum oxide ($Al_2O_3$), powders of, for example, silica ($SiO_2$), magnesia (MgO), or calcium oxide (CaO), are added as a sintering aid to $Al_2O_3$ powder, and an appropriate binder, an appropriate solvent, and an appropriate plasticizer are added to the powder mixture, which is then kneaded to form slurry. The slurry is then shaped into sheets using a doctor blade or calendaring to obtain the ceramic green sheet for forming a multi-piece wiring substrate.

The wiring board 2 comprising, for example, a resin may be molded using a mold having a predetermined shape by transfer molding or injection molding.

The wiring board 2 may be comprising a glass epoxy resin, which is a base glass fiber impregnated with a resin. In this case, the base glass fiber is impregnated with a precursor of an epoxy resin. The epoxy resin precursor is then cured by heat at a predetermined temperature to form the wiring board 2.

(2) A metal paste is then applied or placed, by screen printing or other techniques, into the areas to be the electronic component connection pads 3, the electrodes for connection to external circuits, the inner wires, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the wiring board 2.

(3) The above green sheet is then processed using, for example, a mold. An opening is formed in the center of the green sheet to be the wiring board 2. The grooves 2a may also be formed using, for example, a mold at a predetermined portion in the green sheet to be the wiring board 2.

(4) The ceramic green sheets to be the insulating layers are then stacked and pressed to form a ceramic green sheet laminate, which is to be the wiring board 2. In this process, a through-hole may be formed in each green sheet to be an insulating layer, and the green sheets are stacked and pressed to form a ceramic green sheet laminate, which is to be the wiring board 2. In this process, the grooves 2a may be formed in each green sheet to be an insulating layer, and the green sheets are stacked and pressed to form a ceramic green sheet laminate, which is to be the wiring board 2, or the grooves 2a may be formed after multiple green sheets to be the wiring board 2 are stacked.

(5) This ceramic green sheet laminate is then fired at about 1,500 to 1,800° C. to obtain a multi-piece wiring substrate including an array of wiring boards 2. In this process, the metal paste described above is fired together with the ceramic green sheet to be each wiring board 2 to form the electronic component connection pads 3, the electrodes for connection to external circuits, the inner wires, and the feedthrough conductors.

(6) The multi-piece wiring substrate obtained through the firing process is then cut into multiple wiring boards 2. In this cutting process, separation grooves may be formed along the outer edge of each wiring board 2, and the multi-piece wiring substrate may be split along the separation grooves into the multiple wiring boards 2. In other embodiments, the multi-piece wiring substrate may be cut along the outer edge of each wiring board 2 by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate to be the multi-piece wiring substrate or by cutting the ceramic green sheet laminate to a depth smaller than its thickness with a slicer.

(7) The inorganic substrate 4 to be bonded to the lower surface of the wiring board 2 is then prepared. The inorganic substrate 4 comprising a metal material is formed by, for example, punching a metal plate using a known stamping mold or etching a metal plate. The inorganic substrate 4 comprising a different material may be formed similarly by, for example, punching suitable for the material. The inorganic substrate 4 comprising a metal material, such as an Fe—Ni—Co alloy, alloy 42, copper (Cu), or a copper alloy, may be coated with a nickel plating layer and a gold plating layer. The plating layers may effectively reduce oxidation and corrosion of the surface of the inorganic substrate 4.

The inorganic substrate 4 comprising electrical insulating ceramics may also be coated with a nickel plating layer and a gold plating layer when the substrate 4 has conductive patterns printed on its surface. The plating layers may effectively reduce oxidation and corrosion of the surface of the inorganic substrate 4. In this process, the downward bends of the inorganic substrate 4 may be formed at intended positions by, for example, pressing or with a mold.

(8) The wiring board 2 is then bonded to the inorganic substrate 4 with the bond 15. The bond 15, which is a thermosetting resin (adhesive) paste, is applied to either or both the bonding surfaces of the wiring board 2 and the inorganic substrate 4 by screen printing or dispensing. After the thermosetting resin is dried, the wiring board 2 and the inorganic substrate 4 remaining stacked are then passed through a furnace, such as an oven or an atmosphere furnace having a tunnel structure, to pressurize and heat the stack. The wiring board 2 and the inorganic substrate 4 are firmly bonded with the thermoset bond.

The bond 15 is prepared by adding a filler containing, for example, spherical silicon oxide particles, a curing agent mainly containing acid anhydrides such as tetrahydromethylphthalic anhydride, and a colorant containing carbon powders to a base agent containing, for example, a bisphenol A liquid epoxy resin, a bisphenol F liquid epoxy resin, or a phenolic novolac liquid epoxy resin. The resultant mixture is stirred using a centrifugal stirrer. The resultant mixture may also be kneaded into a paste. The bond 15 may also be prepared by adding a curing agent such as imidazole, amine, phosphorous, hydrazine, imidazole adduct, amine adduct, cationic polymerization, or dicyandiamide to an epoxy resin such as a bisphenol A epoxy resin, a modified bisphenol A epoxy resin, a bisphenol F epoxy resin, a phenolic novolac epoxy resin, a cresol novolac epoxy resin, a special novolac epoxy resin, a phenol derivative epoxy resin, or an epoxy resin with a bisphenol skeleton.

(9) The electronic component 10 is then mounted in the central area of the inorganic substrate 4. The electronic component 10 is electrically connected to the wiring board 2 by, for example, wire bonding. In some embodiments, the electronic component 10 may be fixed to the inorganic substrate 4 with an adhesive or another bond applied to the electronic component 10 or to the inorganic substrate 4. After the electronic component 10 is mounted in the central area of the inorganic substrate 4, the lid 12 may be bonded to the inorganic substrate 4 with the bond.

The wiring board 2 and the inorganic substrate 4 are combined in this manner to complete the electronic device 21 through the processes (1) to (9). The processes (1) to (9) may be performed in any order.

The inorganic substrate 4 may be bent downward by using the difference between the thermal expansion coefficients of the wiring board 2 and the inorganic substrate 4. For example, the wiring board 2 may have a lower coefficient of thermal expansion than the inorganic substrate 4. The different thermal expansion coefficients of the board and the substrate allow the inorganic substrate 4 to bend downward after the bond 15 is cured through the heating process.

Second Embodiment

Figure 4A:
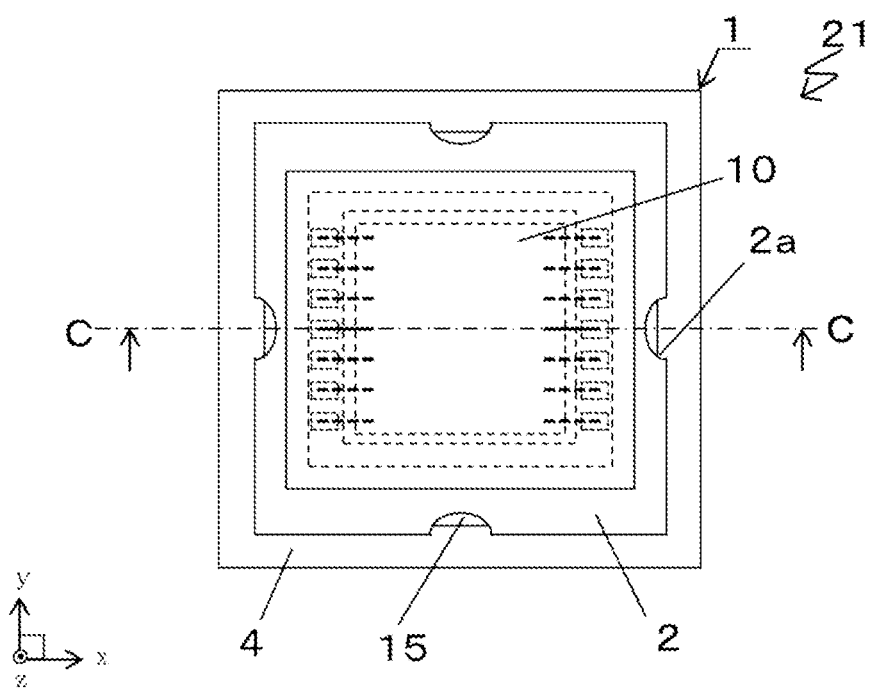
FIG. 4A is an external top view of an electronic component mounting board and an electronic device according to a second embodiment of the present invention.
Figure 4B:
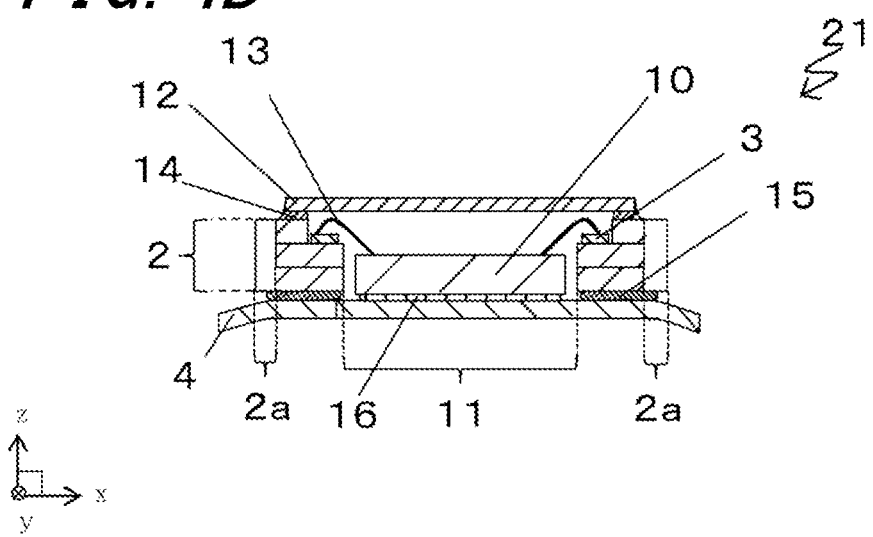
FIG. 4B is a cross-sectional view taken along line C-C in FIG. 4A.

An electronic component mounting board 1 and an electronic device 21 according to a second embodiment of the present invention will now be described with reference to FIGS. 4A and 4B. The electronic component mounting board 1 and the electronic device 21 according to the present embodiment differ from the electronic component mounting board 1 and the electronic device 21 according to the first embodiment in that the wiring board 2 has grooves 2a and the bond has its perimeter uncovered within the grooves 2a.

In the present embodiment, the wiring board 2 includes vertically extending grooves 2a on its outer sides. The bond 15 extends over the grooves 2a as viewed from above. When the electronic component 10 is an imaging device, the grooves 2a in the wiring board 2 typically facilitate alignment of the external housing 19. This further facilitates optical alignment between the imaging device and the lens on the external housing 19. However, the grooves 2a in the wiring board 2 reduce the bonding area between the inorganic substrate 4 and the wiring board 2. As the electronic device 21 tends toward miniaturization, the smaller bonding area lowering the strength of bonding has become an issue to be solved. In the present embodiment, the bond 15 extends over the grooves 2a as viewed from above to increase the bonding area. This also reduces separation between the inorganic substrate 4 and the wiring board 2, and reduces cracks or breaks in the inorganic substrate 4.

In the present embodiment, the external housing 19 may have legs in contact with the bond 15. The bond 15 may thus reduce external stress applied on the external housing 19 and reduce stress directly received by the inorganic substrate 4. This structure thus more effectively reduces cracks or deformation in the inorganic substrate 4, and separation between the inorganic substrate 4 and the wiring board 2.

The bond 15 extending into the grooves 2a as viewed from above in the present embodiment may further extend over the side surfaces. The bond 15 forms fillets to improve the bonding strength between the wiring board 2 and the inorganic substrate 4.

To prepare the electronic component mounting board 1, the bond 15 may be printed to overlap the grooves 2a as viewed from above in the printing process. In some embodiments, the bond 15 may be printed to have a large thickness, and may then be pressed between the inorganic substrate 4 and the wiring board 2 in the bonding process to spread the bond 15 over the grooves 2a.

Third Embodiment

An electronic component mounting board 1 and an electronic device 21 according to a third embodiment of the present invention will now be described with reference to FIGS. 5A to 6B. The electronic component mounting board 1 and the electronic device 21 according to the present embodiment differ from the electronic component mounting board 1 and the electronic device 21 according to each of the first embodiment and the second embodiment in that the inorganic substrate 4 has its outer edge overlapping or inward from the outer edge of the wiring board 2 as viewed from above.

Figure 5A:
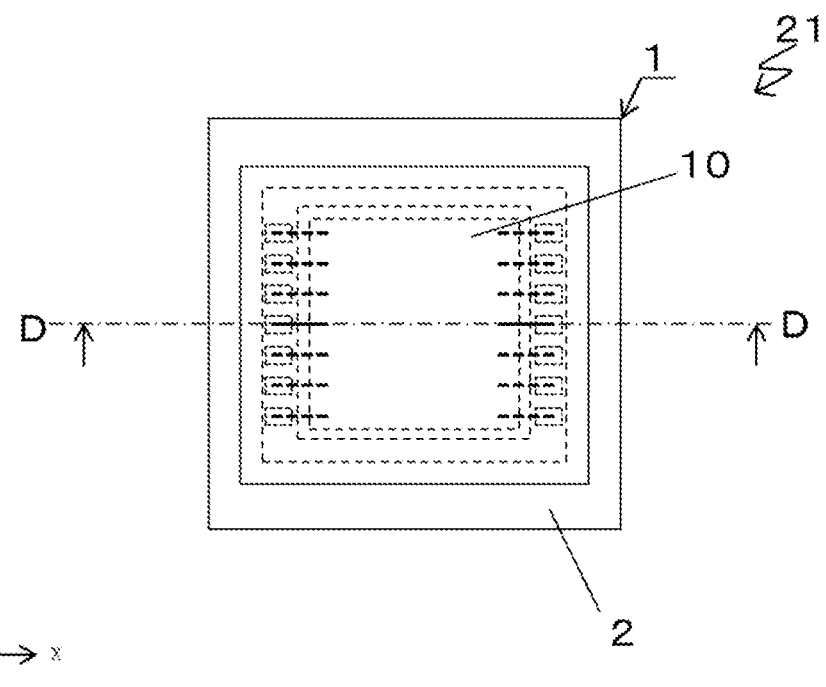
FIG. 5A is an external top view of an electronic component mounting board and an electronic device according to a third embodiment of the present invention.
Figure 5B:
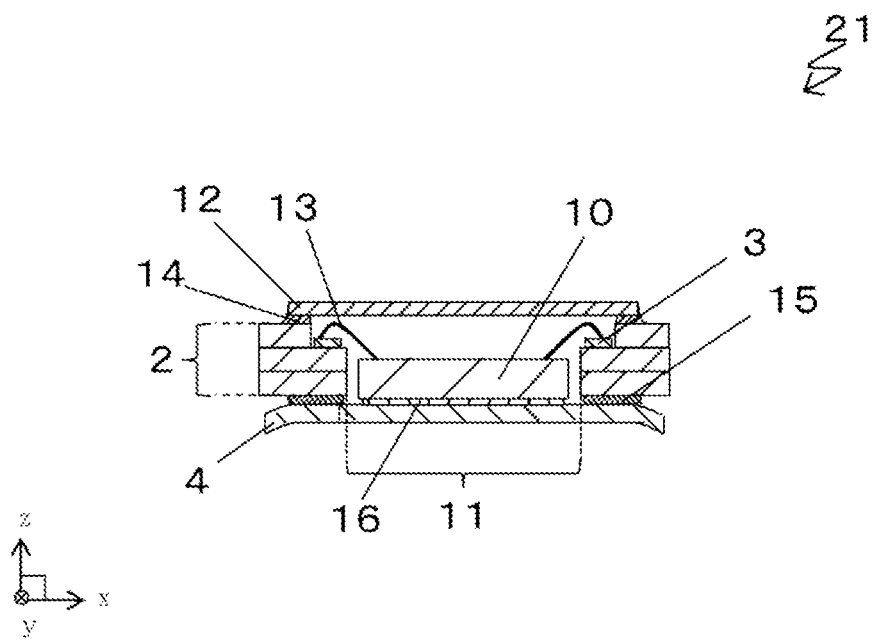
FIG. 5B is a cross-sectional view taken along line D-D in FIG. 5A.
Figure 6A:
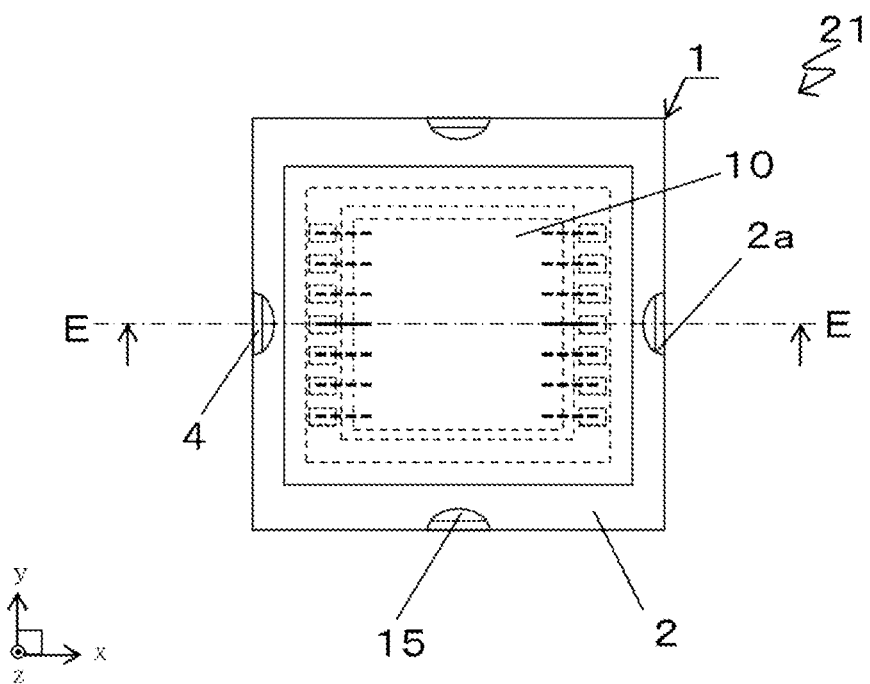
FIG. 6A is an external top view of an electronic component mounting board and an electronic device according to an example of the third embodiment of the present invention.
Figure 6B:
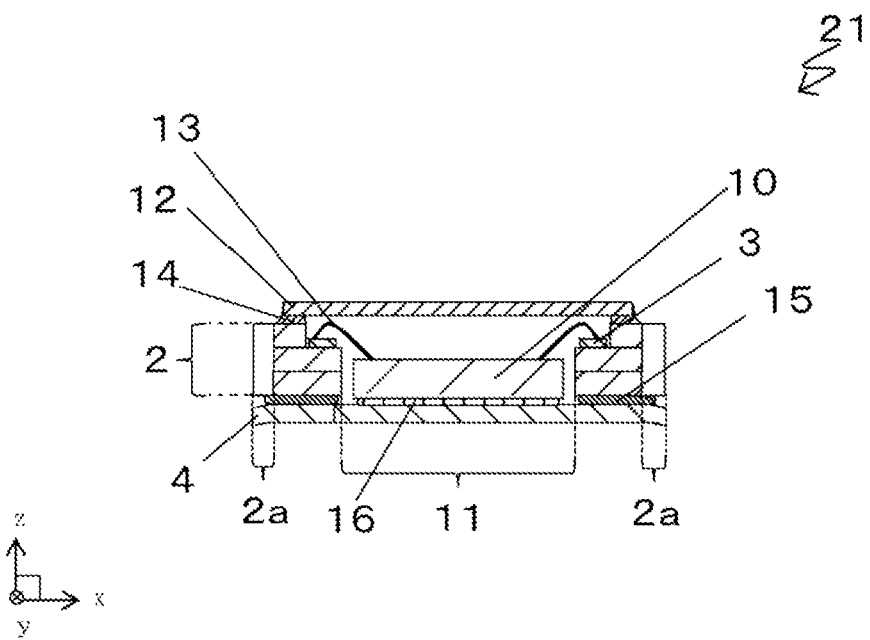
FIG. 6B is a cross-sectional view taken along line E-E in FIG. 6A.

In the example shown in FIG. 5A, the inorganic substrate 4 has its outer edge inward from the outer edge of the wiring board 2 as viewed from above. In the example shown in FIG. 6A, the inorganic substrate 4 has its outer edge overlapping the outer edge of the wiring board 2 as viewed from above. The inorganic substrate 4 having its outer edge at the same position as or inward from the outer edge of the wiring board 2 allows miniaturization of the electronic device 21.

The smaller inorganic substrate 4 can have smaller downward bends. This reduces breaks or cracks in the inorganic substrate 4 under a large force applied to its lower surface.

Fourth Embodiment

An electronic component mounting board 1 and an electronic device 21 according to a fourth embodiment of the present invention will now be described with reference to FIGS. 7A and 7B. The electronic component mounting board 1 and the electronic device 21 according to the present embodiment differ from the electronic component mounting board 1 and the electronic device 21 according to the third embodiment in that the inorganic substrate 4 includes a flat outer edge portion.

Figure 7A:
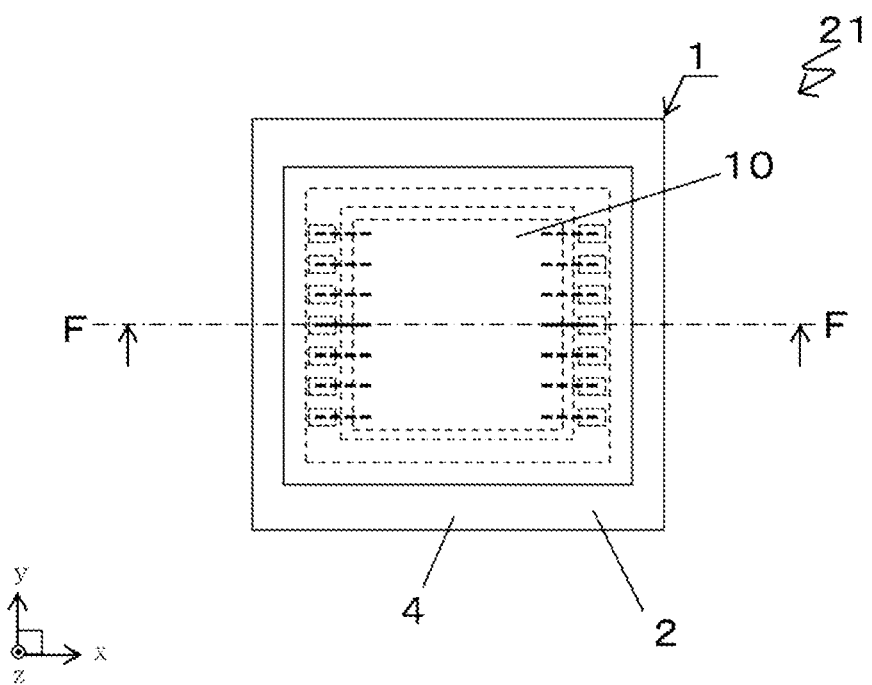
FIG. 7A is an external top view of an electronic component mounting board and an electronic device according to a fourth embodiment of the present invention.
Figure 7B:
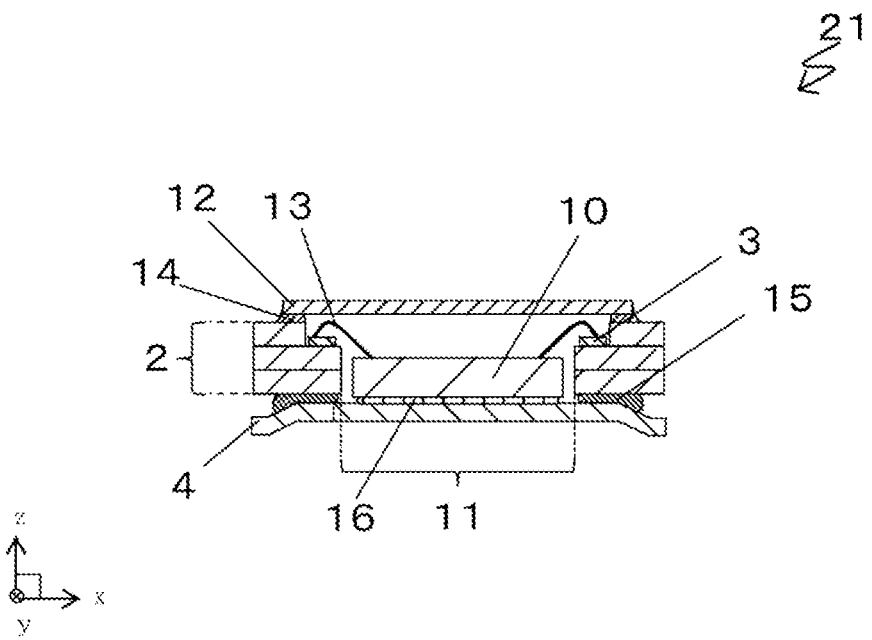
FIG. 7B is a cross-sectional view taken along line F-F in FIG. 7A.

In the example shown in FIGS. 7A and 7B, the inorganic substrate 4 includes a flat portion at its outermost perimeter. The flat outermost perimeter portion of the inorganic substrate 4 more easily absorbs stress applied on the electronic component mounting board 1 when dropped, and thus allows less stress reaching the wiring board 2. This structure thus more effectively reduces cracks or breaks in the wiring board 2. The flat portion may be positioned to address the stress, which is obtained by calculation, to be applied through the external housing 19. This more effectively reduces stress applied to the wiring board 2.

The flat portion of the inorganic substrate 4 shown in FIGS. 7A and 7B receives external stress. A support point between the flat portion and the slope of the inorganic substrate 4 can function as a spring under stress applied to the inorganic substrate 4 to more effectively absorb stress. This reduces cracks or breaks in the wiring board 2.

To prepare the electronic component mounting board 1, a portion of the inorganic substrate 4 to be the flat portion may be pressed and processed using a mold to form the flat portion.

Fifth Embodiment

An electronic component mounting board 1 and an electronic device 21 according to a fifth embodiment of the present invention will now be described with reference to FIGS. 8A to 9B. The electronic component mounting board 1 and the electronic device 21 according to the present embodiment differ from the electronic component mounting board 1 and the electronic device 21 according to the first embodiment in that the electronic component mounting board 1 includes a flexible board 5 between the wiring board 2 and the inorganic substrate 4.

Figure 8A:
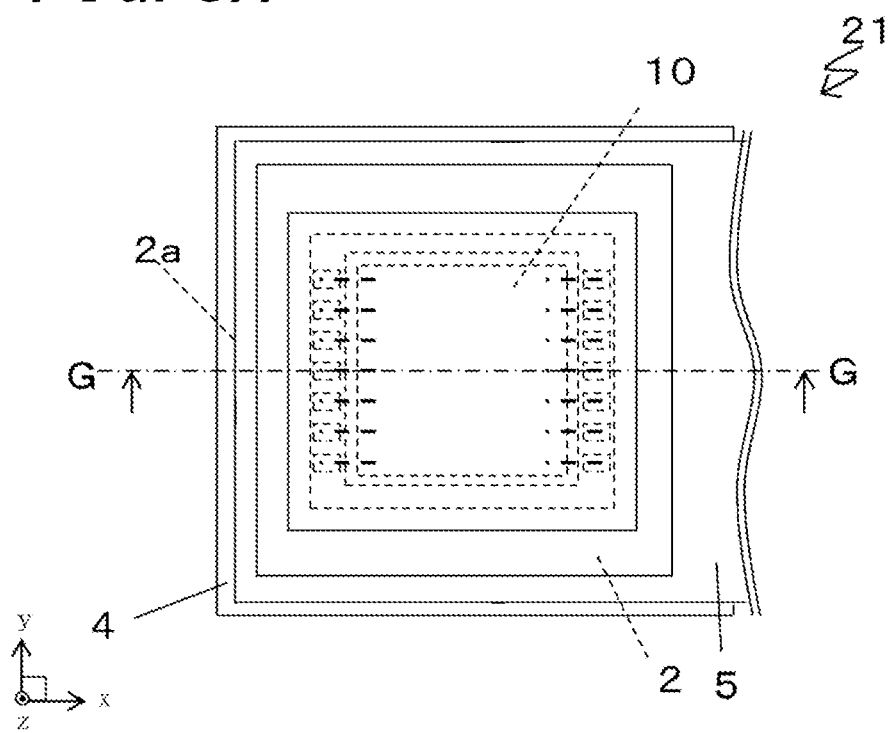
FIG. 8A is an external top view of an electronic component mounting board and an electronic device according to a fifth embodiment of the present invention.
Figure 8B:
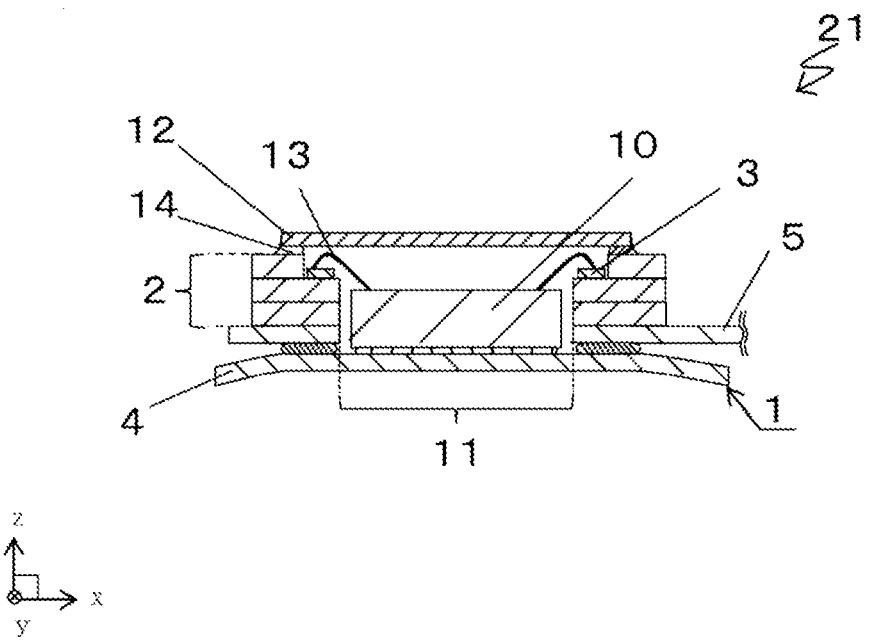
FIG. 8B is a cross-sectional view taken along line G-G in FIG. 8A.

In the example shown in FIGS. 8A and 8B, the electronic component mounting board 1 further includes the flexible board 5 between the upper surface of the inorganic substrate 4 and the lower surface of the wiring board 2. The flexible board 5 is a frame surrounding the electronic component mounting portion 11. The flexible board 5 increases the distance between the inorganic substrate 4 and the wiring board 2, and thus more effectively reduces stress applied on the inorganic substrate 4 reaching the wiring board 2. The flexible board 5 with a low Young's modulus placed between the wiring board 2 and the inorganic substrate 4 may absorb stress applied on the inorganic substrate 4. This structure thus reduces stress applied on the inorganic substrate 4 reaching the wiring board 2.

Figure 9A:
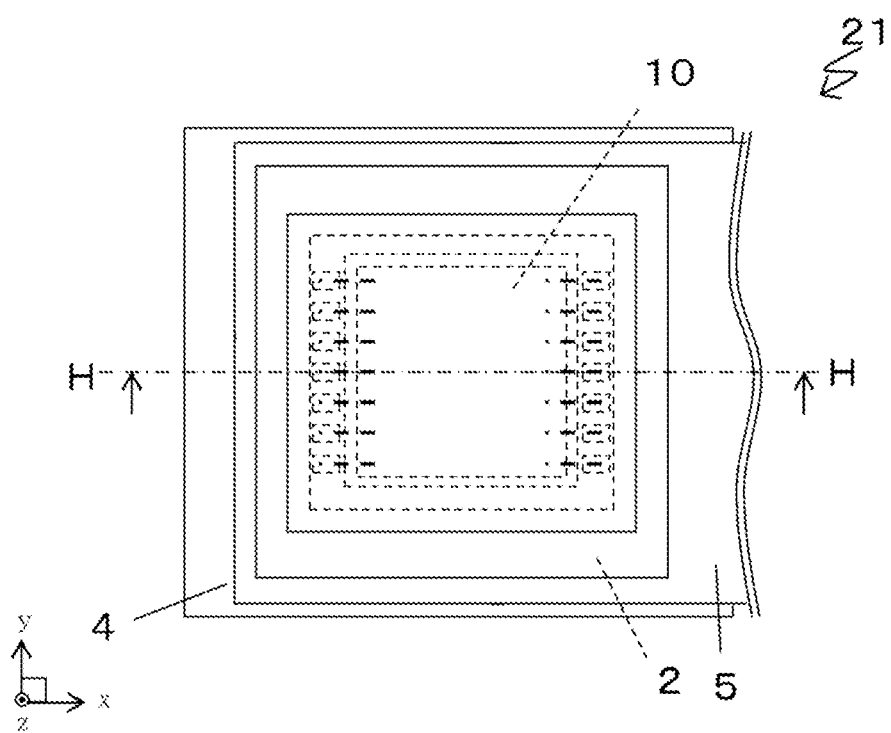
FIG. 9A is an external top view of an electronic component mounting board and an electronic device according to a fifth embodiment of the present invention.
Figure 9B:
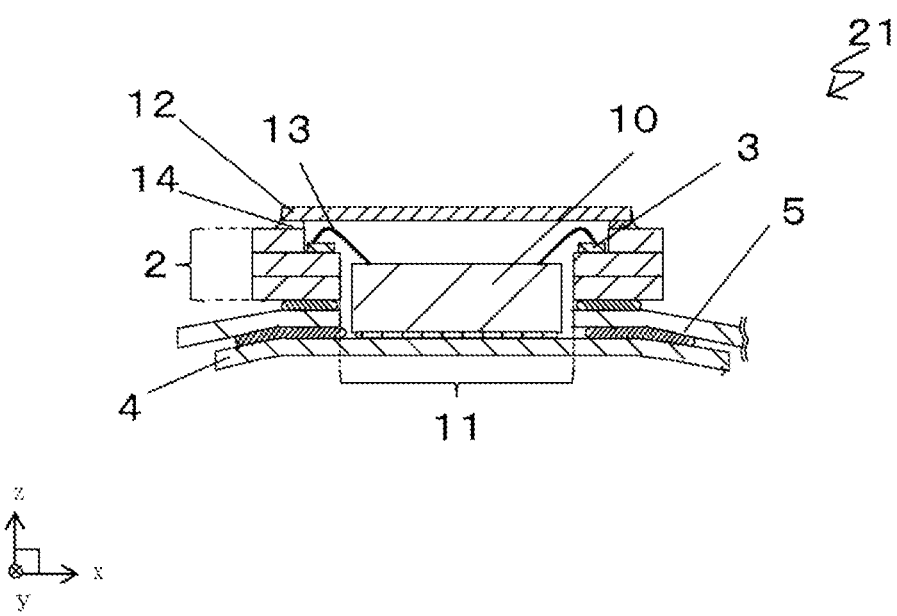
FIG. 9B is a cross-sectional view taken along line H-H in FIG. 9A.

In the example shown in FIG. 9B, the flexible board 5 may bend in the same direction as the inorganic substrate 4 as viewed in cross section. As shown in FIG. 9A, the flexible board 5 has its outer edge outward from the outer edges of the wiring board 2 and the inorganic substrate 4 as viewed from above. The flexible board 5 can absorb an external force applied laterally.

The flexible board 5 includes, for example, a base film. Examples of the material for the base film include an insulator comprising a resin, such as a polyimide film. The flexible board 5 includes a conductive layer on the upper surface of the base film. The conductive layer may be a layer of, for example, copper, aluminum, gold, or nickel, or an alloy containing one or more of these metal materials.

The uncovered surface of the conductive layer may be plated. The plating layer protects the uncovered surface of the conductive layer against oxidation. The plating also improves electrical connection between the wiring board 2 and the conductive layer. The plating layer may be, for example, a Ni plating layer with a thickness of 0.5 to 10 μm, which may further be coated with a gold (Au) plating layer with a thickness of 0.5 to 3 µm. The plating layer may further be plated with Sn.

The flexible board 5 includes a cover film located on the upper surface of the conductive layer. The cover film protects the surface of the conductive layer. The film is comprising a resin material, such as a polyimide film, and has an adhesive applied on one surface. The film is located on the surface of the conductive layer excluding its portions to be electrically connected to the wiring board 2. The flexible board 5 may be connected to the wiring board 2 with a conductive bond.

The bond 15 for bonding the flexible board 5 and the inorganic substrate 4, and an adhesive for bonding the flexible board 5 and the wiring board 2 are comprising, for example, a material difficult to alter under heat applied during mounting of the electronic component 10. Examples of the material for the bond 15 and the adhesive include a bisphenol A liquid epoxy resin and a polyimide resin. Such materials efficiently reduce separation of the flexible board 5 from the inorganic substrate 4 or from the wiring board 2 during mounting of the electronic component 10. The bond 15 and the adhesive may be conductive to electrically connect the flexible board 5 to the wiring board 2 or to the inorganic substrate 4. Examples of the conductive bond 15 or the conductive adhesive include silver epoxy, solder, an anisotropic conductive resin (anisotropic conductive paste or ACP), and an anisotropic conductive film (ACF).

In the example shown in FIG. 8A, the flexible board 5 is located inward from the inorganic substrate 4 as viewed from above. This structure allows the outer profile of the electronic device 21 to be entirely uniform in correspondence with the outer edge of the inorganic substrate 4. This allows the electronic device 21 to be miniaturized and also to have uniform external dimensions.

In the present embodiment, the flexible board 5 may have holes to overlap the grooves 2a in the wiring board 2 as viewed from above. This allows the legs of the external housing 19 to be bonded to the inorganic substrate 4 through the grooves 2a and the holes in the flexible board 5. Stress applied through the external housing 19 can escape to the inorganic substrate 4, thus reducing cracks or breaks in the wiring board 2. The bond 15 may extend over either or both the grooves 2a in the wiring board 2 and the holes in the flexible board 5. The bond 15 extending over the grooves 2a or the holes or both form fillets to improve the bonding strength between the wiring board 2 and the flexible board 5 or between the flexible board 5 and the inorganic substrate 4.

REFERENCE SIGNS LIST

1 electronic component mounting board
2 wiring board
2a groove
3 electronic component connection pad
4 inorganic substrate
5 flexible board
10 electronic component
11 electronic component mounting portion
12 lid
13 connection
14 bond member
15 bond
16 adhesive
19 external housing
21 electronic device
31 electronic module

The invention claimed is:

1. An electronic component mounting board, comprising:
    an inorganic substrate;
    an electronic component mounting portion formed in a central area of an upper surface of the inorganic substrate;
    a wiring board that surrounds the electronic component mounting portion and is formed on the upper surface of the inorganic substrate, wherein the wiring board is formed from a different material than the inorganic substrate; and
    a bond that connects a bond area of the upper surface of the inorganic substrate and a lower surface of the wiring board, wherein the inorganic substrate includes a downward bend outward from the bond area, and
    wherein an end of the inorganic substrate that is outward from the bond area is not parallel to the bond area.

2. The electronic component mounting board according to claim 1, wherein
    the wiring board includes vertically extending grooves on outer sides thereof, and
    the bond extends over the grooves as viewed from above.

3. The electronic component mounting board according to claim 1, wherein
    the wiring board is rectangular, and includes vertically extending grooves on outer sides thereof, and
    the grooves are located at corners of the wiring board as viewed from above.

4. The electronic component mounting board according to claim 1, wherein
    the wiring board has an outer edge inward from an outer edge of the inorganic substrate.

5. The electronic component mounting board according to claim 1, wherein
    the inorganic substrate includes a flat portion at an outermost perimeter.

6. The electronic component mounting board according to claim 1, further comprising:
    a flexible board that surrounds the electronic component mounting portion, wherein the flexible board is formed between the upper surface of the inorganic substrate and the lower surface of the wiring board.

7. An electronic device, comprising:
    the electronic component mounting board according to claim 1; and
    an electronic component mounted on the electronic component mounting portion.

8. The electronic component mounting board according to claim 2, wherein
    the wiring board is rectangular, and includes vertically extending grooves on outer sides thereof, and
    the grooves are located at corners of the wiring board as viewed from above.

9. The electronic component mounting board according to claim 2, wherein
    the wiring board has an outer edge inward from an outer edge of the inorganic substrate.

10. The electronic component mounting board according to claim 2, wherein
    the inorganic substrate includes a flat portion at an outermost perimeter.

11. The electronic component mounting board according to any one of claim 2, further comprising:
    a flexible board that surrounds the electronic component mounting portion, wherein the flexible board is formed between the upper surface of the inorganic substrate and the lower surface of the wiring board.

12. The electronic component mounting board according to claim 3, wherein
the wiring board has an outer edge inward from an outer edge of the inorganic substrate.

13. The electronic component mounting board according to claim 3, wherein
the inorganic substrate includes a flat portion at an outermost perimeter.

14. The electronic component mounting board according to claim 3, further comprising:
a flexible board that surrounds the electronic component mounting portion, wherein the flexible board is formed between the upper surface of the inorganic substrate and the lower surface of the wiring board.

15. The electronic component mounting board according to claim 4, wherein
the inorganic substrate includes a flat portion at an outermost perimeter.

16. The electronic component mounting board according to claim 4, further comprising:
a flexible board that surrounds the electronic component mounting portion, wherein the flexible board is formed between the upper surface of the inorganic substrate and the lower surface of the wiring board.

17. The electronic component mounting board according to claim 5, further comprising:
a flexible board that surrounds the electronic component mounting portion, wherein the flexible board is formed between the upper surface of the inorganic substrate and the lower surface of the wiring board.

18. The electronic component mounting board according to claim 1, wherein in planar fluoroscopy, the inorganic substrate comprises an overlapped region where the wiring board overlaps the inorganic substrate, and
the overlapped region includes a first region located apart from the wiring board with a space not including the bond.

19. The electronic component mounting board according to claim 5, wherein the flat portion is parallel to the electronic component mounting portion.

20. The electronic component mounting board according to claim 1, wherein the bond extends over the downward bend.

* * * * *